(12) United States Patent
Shindo et al.

(10) Patent No.: US 7,578,965 B2
(45) Date of Patent: Aug. 25, 2009

(54) HIGH-PURITY RU POWDER, SPUTTERING TARGET OBTAINED BY SINTERING THE SAME, THIN FILM OBTAINED BY SPUTTERING THE TARGET AND PROCESS FOR PRODUCING HIGH-PURITY RU POWDER

(75) Inventors: Yuichiro Shindo, Ibaraki (JP); Akira Hisano, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 313 days.

(21) Appl. No.: 10/598,471

(22) PCT Filed: Feb. 2, 2005

(86) PCT No.: PCT/JP2005/001488

§ 371 (c)(1),
(2), (4) Date: Aug. 31, 2006

(87) PCT Pub. No.: WO2005/083136

PCT Pub. Date: Sep. 9, 2005

(65) Prior Publication Data

US 2007/0240992 A1 Oct. 18, 2007

(30) Foreign Application Priority Data

Mar. 1, 2004 (JP) ............................. 2004-056022

(51) Int. Cl.
C22C 5/04 (2006.01)
C22C 1/04 (2006.01)
B22F 9/00 (2006.01)
C21B 15/04 (2006.01)
C22B 5/20 (2006.01)

(52) U.S. Cl. ......................................... 420/462; 75/343

(58) Field of Classification Search ................. 148/400, 148/430; 420/462; 75/300, 228, 245, 246, 75/247

See application file for complete search history.

(56) References Cited

U.S. PATENT DOCUMENTS 6,036,741 A 3/2000 Shindo et al.
6,284,013 B1 9/2001 Shindo et al.
6,589,311 B1 7/2003 Han et al.
6,676,728 B2 1/2004 Han et al.
2004/0144204 A1 7/2004 Hisano
2006/0071197 A1 4/2006 Suzuki

FOREIGN PATENT DOCUMENTS

JP 2000-178721 A 6/2000
JP 2001-020065 * 1/2001
JP 2002-105631 A 4/2002
JP 2002-167668 A 6/2002

OTHER PUBLICATIONS

JP 2001-020065. English abstract and English machine translation.*
Esp@cenet database, one page English Abstract of JP 11-217633, Aug. 1999.
Esp@cenet database, one page English Abstract of JP 9-041131, Feb. 1997.
Esp@cenet database, one page English Abstract of JP 9-227966, Sep. 1997.
Esp@cenet database, one page English Abstract of JP 8-199350, Aug. 1996.
Esp@cenet database, one page English Abstract of JP 8-302462, Nov. 1996.

* cited by examiner

*Primary Examiner*—George Wyszomierski
*Assistant Examiner*—Vanessa Velasquez
(74) *Attorney, Agent, or Firm*—Howson & Howson LLP

(57) ABSTRACT

A high purity Ru powder wherein the content of the respective alkali metal elements such as Na and K is 10 wtppm or less, and the content of Al is in the range of 1 to 50 wtppm. Further provided is a manufacturing method of such high purity Ru powder wherein Ru raw material having a purity of 3N (99.9%) or less is used as an anode and electrolytic refining is performed in a solution. Further still, provided is a high purity Ru powder for manufacturing a sputtering target which is capable of reducing harmful substances as much as possible, generates few particles during deposition, has a uniform film thickness distribution, has a purity of 4N (99.99%) or higher, and is suitable in forming a capacitor electrode material of a semiconductor memory; a sputtering target obtained by sintering such high purity Ru powder; a thin film obtained by sputtering this target; and a manufacturing method of the foregoing high purity Ru powder.

14 Claims, No Drawings

HIGH-PURITY RU POWDER, SPUTTERING TARGET OBTAINED BY SINTERING THE SAME, THIN FILM OBTAINED BY SPUTTERING THE TARGET AND PROCESS FOR PRODUCING HIGH-PURITY RU POWDER

BACKGROUND OF THE IVENTION

The present invention pertains to a high purity Ru powder for manufacturing a sputtering target having a purity of 4N (99.99%) or higher and which is suitable in forming a capacitor electrode material of a semiconductor memory, a sputtering target obtained by sintering such high purity Ru powder, a thin film obtained by sputtering said target, and a manufacturing method of the foregoing high purity Ru powder.

Today, the use of Ru as an electrode material or the like of a semiconductor capacitor is rapidly expanding. This kind of electrode is generally formed by sputtering a Ru target.

In order to guarantee the operational performance as a reliable semiconductor, it is important to reduce as much as possible impurities in the foregoing materials formed after sputtering that are harmful to the semiconductor device.

In other words, it is desirable to reduce:
alkali metal elements such as Na and K;
radioactive elements such as U and Th; and
transition metal elements such as Fe, Ni, Co, Cr and Cu;
as much as possible, and realize a purity of 4N or higher; that is, 99.99% (weight) or higher.

The reason the foregoing impurities are harmful is that alkali metals such as Na and K move easily in the gate insulator and cause the MOS-LSI interfacial quality to deteriorate, radioactive elements such as U and Th cause a soft error of elements due to alpha ray emitted from such elements, and transition metal elements such as Fe, Ni, Co, Cr and Cu contained as impurities cause trouble at the interface bonding.

Among the above, the harmful effect of alkali metals such as Na and K is particularly pointed out. Contrarily, transition metal elements such as Fe, Ni, Co, Cr and Cu are not considered to be as harmful, and the existence thereof of a certain amount is tolerated.

When reviewing the composition of conventional Ru targets, disclosed is ruthenium wherein the content of respective alkali metal elements is less than 1 ppm, the content of respective alkali earth metal elements is less than 1 ppm, the content of respective transition metal elements is less than 1 ppm, the content of respective radioactive elements is less than 10 ppb, the content of carbon and gas component elements (oxygen, hydrogen, nitrogen, chlorine) is less than 500 ppm in total, purity of ruthenium excluding gas components is 99.995% or higher, and the content of Al and Si is respectively less than 1 ppm (for instance, refer to Patent Document 1). Further, disclosed is ruthenium wherein the content of the respective elements of carbon, oxygen and chlorine is 100 ppm or less, and the purity of ruthenium excluding gas components is 99.995% or higher (for instance, refer to Patent Document 2). Moreover, disclosed is ruthenium wherein iron elements content is 5 ppm or less, the content of alkali metal elements is 1 ppm, the content of radioactive elements is 0.01 ppm or less, and tungsten content is 1 ppm or less (for instance, refer to Patent Document 3). In addition, disclosed is a high purity ruthenium sputtering target having a purity of 99.999wt % or higher (for instance, refer to Patent Document 4). Further, disclosed is a high purity ruthenium sputtering target wherein the content of respective alkali metal elements is 0.1 wtppm or less, the content of respective alkali earth metal elements is 0.1 wtppm or less, the content of respective transition metal elements excluding platinum group elements is 0.1 wtppm or less, the content of respective radioactive isotopes is 1 wtppb or less, the content of gas component elements is 30 wtppm or less in total, and having a purity of 99.995wt % (for instance, refer to Patent Document 5). Moreover, disclosed is a high purity ruthenium powder wherein the content of respective alkali metals, alkali earth metals, aluminum, iron, nickel, and copper is 0.1 ppm or less (for instance, refer to Patent Document 6). In addition, disclosed is a ruthenium sputtering target wherein the content of Na, K, Ca and Mg is 5 ppm or less in total, the content of one type or more among Fe, Ni and Co is in the range of 0.5 to 50 ppm, the content of radioactive isotopes is 5 ppb or less, and having a purity of 99.999wt % or higher excluding Fe, Ni and Co (for instance, refer to Patent Document 7). Further, disclosed is a high purity ruthenium sputtering target having a purity of 99.999% or higher (for instance, refer to Patent Document 8).

[Patent Document 1] Japanese Patent Laid-Open Publication No. H11-50163
[Patent Document 2] Japanese Patent Laid-Open Publication No. 2000-34563
[Patent Document 3] Japanese Patent Laid-Open Publication No. H11-217633
[Patent Document 4] Japanese Patent Laid-Open Publication No. H9-41131
[Patent Document 5] Japanese Patent Laid-Open Publication No. 2002-105631
[Patent Document 6] Japanese Patent Laid-Open Publication No. H9-227966
[Patent Document 7] Japanese Patent Laid-Open Publication No. H8-199350
[Patent Document 8] Japanese Patent Laid-Open Publication No. H8-302462

When reviewing the foregoing Patent Documents, it could be said that they all disclose technology for reducing as much as possible the impurities in ruthenium considered to be harmful and realizing even higher purity in order to guarantee the operational performance as a semiconductor.

Nevertheless, as a sputtering target to be used in forming a capacitor electrode material of a semiconductor memory, characteristics where the generation of particles during deposition is minimal and the film thickness distribution is uniform are required, but there is a problem in that such characteristics are insufficient under existing circumstances.

SUMMARY OF THE IVENTION

Thus, an object of the present invention is to provide a high purity Ru powder for manufacturing a sputtering target which is capable of reducing harmful substances as much as possible, generates few particles during deposition, has a uniform film thickness distribution, has a purity of 4N (99.99%) or higher, and is suitable in forming a capacitor electrode material of a semiconductor memory; a sputtering target obtained by sintering such high purity Ru powder; a thin film obtained by sputtering said target; and a manufacturing method of the foregoing high purity Ru powder.

The present invention provides 1) a high purity Ru powder wherein the content of the respective alkali metal elements such as Na and K is 10 wtppm or less, and the content of Al is in the range of 1 to 50 wtppm; 2) a high purity Ru powder wherein the content of Al is in the range of 5 to 20 wtppm; 3) the high purity Ru powder according to 1) or 2) above, wherein the total content of transition metal elements such as Fe, Ni, Co, Cr and Cu is 100 wtppm or less, and the content of the respective radioactive elements such as U and Th is 10 wtppb or less; 4) the high purity Ru powder according to any one of 1) to 3) above, wherein the purity excluding gas components such as oxygen, nitrogen and hydrogen is 99.99% or higher; 5) the high purity Ru powder according to 4) above, wherein the content of oxygen is 100 wtppm or less; 6) a sputtering target obtained by sintering the high purity Ru powder according to any one of 1) to 5) above and a thin film obtained by sputtering said target; and 7) a manufacturing method of the high purity Ru powder according to any one of 1) to 5) above, wherein Ru raw material having a purity of 3N (99.9%) or less is used as an anode and electrolytic refining is performed in a solution.

As a result of making the content of the respective alkali metal elements such as Na and K to be 10 wtppm or less, and including Al in a range of 1 to 50 wtppm in a high purity Ru powder to become the raw material in manufacturing a target, it is possible to manufacture a target which generates few particles during deposition, and has a uniform film thickness distribution. It is thereby possible to obtain a thin film having extremely superior characteristics and which is useful as an electrode material for a dielectric thin film memory.

DETAILED DESCRIPTION OF THE INVENTION

With the high purity Ru powder of the present invention, the content of the respective alkali metal elements such as Na and K are 10 wtppm or less, and the content of Al is in the range of 1 to 50 wtppm. It is desirable that the purity excluding Al and gas components such as oxygen, nitrogen and hydrogen is 99.99% or higher, and preferably 99.999% or higher.

The reason the content of the respective alkali metal elements such as Na and K is made to be 10 wtppm or less is because alkali metals move easily in the gate insulator and cause the MOS-LSI interfacial quality to deteriorate. The harmful effect of alkali metals is being strongly pointed out.

In order to suppress the deterioration of the interfacial quality, it is necessary to make the content of the respective alkali metal elements to be 10 wtppm or less.

What is characteristic about the present invention is that Al is added in a range of 1 to 50 wtppm. This addition of Al makes the target structure fine and give random crystal orientation, and thereby it was possible to yield the effect of reducing the generation of particles during deposition and making the film thickness distribution uniform.

Conventionally, Al was considered to be an undesirable element and was reduced as much as possible to be less than 1 ppm. Nevertheless, not only does Al have a small influence on the semiconductor characteristics, it yields superior effects as described above. Al plays a role as a preferable element to be added rather than as an impurity inflicting adverse effects. Preferably, the content of Al is in the range of 5 to 20 wtppm.

When the Al content exceeds 50 wtppm, the particles tend to increase. This is considered to be because Al begins to exist as foreign matter such as $Al_2O_3$. Therefore, it is necessary to make the upper limit of the Al content to be 50 wtppm.

Further, the total content of transition metal elements such as Fe, Ni, Co, Cr and Cu is 100 wtppm or less, and the content of the respective radioactive elements such as U and Th is 10 wtppb or less. This is because transition metal elements such as Fe, Ni, Co, Cr and Cu contained as impurities cause trouble at the interface bonding. Since radioactive elements such as U and Th cause a soft error of elements due to alpha ray emitted from such elements, it is desirable to make the content of the respective radioactive elements to be 10 wtppb or less.

Although transition metal elements do not have a major impact as impurities on semiconductor equipment, it is desirable that the total content thereof is 100 wtppm or less.

Further, it is desirable that the total content of gas components such as oxygen, nitrogen and hydrogen is 1000 wtppm or less. This is in order to reduce the generation of particles.

The high purity Ru powder is manufactured by using Ru raw material having a purity of 3N (99.9%) or less as an anode, and performing electrolytic refining in an acidic or ammonia solution. As the acid, it is desirable to use a solution of nitric acid, hydrochloric acid or the like. As a result, it is possible to obtain a stable high purity Ru powder at a relatively low cost.

A sputtering target can be obtained by sintering the high purity Ru powder manufactured as described above.

In addition, by sputtering the foregoing target on a substrate, it is possible to obtain a thin film having superior uniformity and superior characteristics as an electrode material for a dielectric thin film memory.

EXAMPLES

Examples of the present invention are now explained. These Examples merely illustrate a preferred example, and the present invention shall in no way be limited thereby. In other words, all modifications, other embodiments and modes covered by the technical spirit of the present invention shall be included in this invention.

Example 1

Roughly 2 kg of Ru powder having a purity level of 3N shown in Table 1 was placed in an anode box utilizing a diaphragm. Graphite was used as a cathode. Nitric acid of pH2 was used as the electrolytic solution, and electrolytic refining was performed for 20 hours with current of 5 A. Thereafter, Ru powder was removed from the anode box and cleansed and dried.

Purity of the obtained Ru powder is similarly shown in Table 1. The contents of Na and K were respectively 2 wtppm and 0.5 wtppm, and the Al content was 10 wtppm.

The Ru powder was hot pressed and sintered at 1400° C. to form a target. In addition, sputtering was performed with this target.

The results are similarly shown in Table 1. As shown in Table 1, a superior effect was yielded in that there was minimal generation of particles during deposition, and the obtained thin film has a uniform film thickness distribution.

Example 2

Roughly 2 kg of Ru powder having a purity level of 3N shown in Table 1 was placed in an anode box utilizing a diaphragm. Graphite was used as a cathode. Hydrochloric acid of pH2 was used as the electrolytic solution, and electrolytic refining was performed for 20 hours with current of 5 A. Thereafter, Ru powder was removed from the anode box and cleansed and dried.

Purity of the obtained Ru powder is similarly shown in Table 1. The contents of Na and K were respectively 4 wtppm and 1 wtppm, and the Al content was 15 wtppm.

The Ru powder was hot pressed and sintered at 1400° C. to form a target. In addition, sputtering was performed with this target.

The results are similarly shown in Table 1. As shown in Table 1, a superior effect was yielded in that the there was minimal generation of particles during deposition, and the obtained thin film has a uniform film thickness distribution.

Example 3

Roughly 2 kg of Ru powder having a purity level of 3N shown in Table 1 was placed in an anode box utilizing a diaphragm. Graphite was used as a cathode. Ammonia solution of pH9 was used as the electrolytic solution, and electrolytic refining was performed for 20 hours with current of 5 A. Thereafter, Ru powder was removed from the anode box and cleansed and dried.

Purity of the obtained Ru powder is similarly shown in Table 1. The contents of Na and K were respectively 0.5 wtppm and 0.1 wtppm, and the Al content was 7 wtppm.

The Ru powder was hot pressed and sintered at 1400° C. to form a target. In addition, sputtering was performed with this target.

The results are similarly shown in Table 1. As shown in Table 1, a superior effect was yielded in that the there was minimal generation of particles during deposition, and the obtained thin film has a uniform film thickness distribution.

Example 4

Roughly 2 kg of Ru powder having a purity level of 3N shown in Table 1 was placed in an anode box utilizing a diaphragm. Graphite was used as a cathode. Hydrochloric acid of pH2 was used as the electrolytic solution, 1 mg/L of $AlCl_3$ was added, and electrolytic refining was performed for 20 hours with current of 5 A. Thereafter, Ru powder was removed from the anode box and cleansed and dried.

Purity of the obtained Ru powder is similarly shown in Table 1. The contents of Na and K were respectively 6 wtppm and 3 wtppm, and the Al content was 43 wtppm.

The Ru powder was hot pressed and sintered at 1400° C. to form a target. In addition, sputtering was performed with this target.

The results are similarly shown in Table 1. As shown in Table 1, although the generation of particles increased slightly and the obtained thin film has a slightly inferior film thickness distribution, these were still within a tolerable range.

Comparative Example 1

Ru powder having a purity level of 3N was hot pressed as is to form a target. The content of Na and K were respectively 80 wtppm and 40 wtppm having the same purity as the raw material, and Al content was 110 wtppm. As a result of performing sputtering with this target, as shown in Table 1, this yielded inferior results where the generation of particles increased and the obtained thin film had a somewhat inferior film thickness distribution.

Comparative Example 2

Ru powder having a purity level of 3N was subject to electron beam melting to obtain a Ru ingot having a purity level of 5N. Since the Ru ingot cannot be rolled, it was cut out as is to prepare a target.

Purity of the obtained Ru ingot is similarly shown in Table 1. The contents of Na and K were respectively <0.1 wtppm and <0.1 wtppm, and the Al content was <0.1 wtppm. Sputtering was performed with this target.

The crystal grain size of the target coarsened, there was significant generation of particles, and the film thickness distribution was extremely inferior. Accordingly, it is evident that a sintered body is preferably used as the Ru target.

Comparative Example 3

A similar manufacturing method of powder as with Example 1 was employed, but the electrolytic refining time was shortened to 5 hours. The obtained Ru powder was used to form a target. Although the target has a purity of 4N, the content of Na, K and Al were above the reference value of the present invention; in other words, the content of Na and K were respectively 40 wtppm and 15 wtppm, and Al content was 70 wtppm.

Subsequently, sputtering was performed with the obtained target. Consequently, as shown in Table 1, there was increased generation of particles, and the film thickness distribution was slightly inferior.

Comparative Example 4

A similar manufacturing method of powder as with Example 1 was employed, but the electrolytic refining time was extended to 100 hours. The obtained Ru powder was used to form a target. Ru powder having a purity of 4N, but containing Al of less than 1 ppm, which is lower than the reference value of the present invention, was used to form a target. The amount of other impurities is as shown in Table 1.

Subsequently, sputtering was performed with the obtained target. Consequently, the grain size increased slightly, the film thickness distribution became inferior, and the number of particles increased.

TABLE 1

| | Raw Material | Example 1 | Example 2 | Example 3 | Example 4 | Comparative Example 1 | Comparative Example 2 | Comparative Example 3 | Comparative Example 4 (ppm) |
|---|---|---|---|---|---|---|---|---|---|
| Na | 80 | 2 | 4 | 0.5 | 6 | 80 | <0.1 | 40 | 0.3 |
| K | 40 | 0.5 | 1 | 0.1 | 3 | 40 | <0.1 | 15 | 0.1 |
| Fe | 38 | 28 | 25 | 30 | 29 | 38 | <0.1 | 35 | 23 |
| Si | 38 | 20 | 21 | 18 | 27 | 38 | <0.1 | 32 | 26 |
| Ir | 2.3 | 2.3 | 2.5 | 2.5 | 2.4 | 2.3 | 2.3 | 2.3 | 2.3 |
| Ti | 1.2 | 1.2 | 1.3 | 1.2 | 1.2 | 1.2 | <0.1 | 1.2 | 1.2 |
| Al | 110 | 10 | 15 | 7 | 43 | 110 | <0.1 | 70 | 0.8 |
| Ni | 2.6 | 2.1 | 2.2 | 2.5 | 2.3 | 2.6 | <0.1 | 2.5 | 2.0 |
| O | 200 | 70 | 80 | 50 | 90 | 200 | <10 | 150 | 40 |
| Average Grain Size of Target (μm) | | 3.6 | 4.0 | 4.0 | 2.5 | 2.0 | 400 | 2.3 | 15 |
| Amount of Particles (Particles/Wafer) | | 5 | 7 | 3 | 10 | 50 | 150 | 40 | 25 |
| Film Thickness Distribution (%) | | ±3 | ±3 | ±3 | ±4 | ±4 | ±15 | ±4 | ±6 |

As a result of making the content of the respective alkali metal elements such as Na and K to be 10 wtppm or less, the content of the respective radioactive elements such as U and Th to be 10 wtppb or less, and including Al content be in a range of 1 to 50 wtppm in a high purity Ru powder to become the raw material in manufacturing a target, it is possible to manufacture a target which is capable of reducing the crystal grain size, generates few particles during deposition, and has a uniform film thickness distribution. It is thereby possible to obtain a thin film having extremely superior characteristics and which is useful as an electrode material for a dielectric thin film memory.

The invention claimed is:

1. A high purity Ru powder wherein the content of the respective alkali metal elements Na and K is 10 wtppm or less, the content of Al is in the range of 7 to 50 wtppm, and the purity excluding oxygen, nitrogen, and hydrogen gas components is 99.99% or higher.

2. A high purity Ru powder according to claim 1, wherein the content of Al is in the range of 7 to 20 wtppm.

3. A high purity Ru powder according to claim 2, wherein the total content of transition metal elements is 100 wtppm or less, and the respective content of radioactive elements is 10 wtppb or less.

4. A high purity Ru powder according to claim 3, wherein the content of oxygen is 100 wtppm or less.

5. A high purity Ru powder according to claim 1, wherein the total content of Fe, Ni, Co, Cr and Cu is 100 wtppm or less, and the respective content of U and Th is 10 wtppb or less.

6. A high purity Ru sputtering target or high purity Ru thin film formed from the sputtering target wherein the respective content of alkali metal elements Na and K is 10 wtppm or less, the content of Al is in the range of 7 to 50 wtppm, and the purity excluding oxygen, nitrogen, and hydrogen gas components is 99.99% or higher.

7. A high purity Ru sputtering target or high purity Ru thin film formed from the sputtering target according to claim 6, wherein the content of Al is in the range of 7 to 20 wtppm.

8. A high purity Ru sputtering target or high purity Ru thin film formed from the sputtering target according to claim 7, wherein the total content of transition metal elements is 100 wtppm or less, and the respective content of radioactive elements is 10 wtppb or less.

9. A high purity Ru sputtering target or high purity Ru thin film formed from the sputtering target according to claim 8, wherein the content of oxygen is 100 wtppm or less.

10. A high purity Ru sputtering target or high purity Ru thin film formed from the sputtering target according to claim 6, wherein the total content of Fe, Ni, Co, Cr and Cu is 100 wtppm or less, and the respective content of U and Th is 10 wtppb or less.

11. A method of manufacturing high purity Ru powder, comprising the steps of using an Ru raw material having a purity of 3N (99.9%) or less as an anode during electrolytic refining, and performing said electrolytic refining in a solution to produce a high purity Ru powder wherein the respective content of alkali metal elements Na and K in the powder is 10 wtppm or less, a content of Al in the powder is in a range of 7 to 50 wtppm, and the purity excluding oxygen, nitrogen, and hydrogen gas components is 99.99% or higher.

12. A method according to claim 11, wherein the content of Al in the powder is in the range of 7 to 20 wtppm.

13. A method according to claim 11, wherein the total content of transition metal elements in the powder is 100 wtppm or less, and the respective content of radioactive elements in the powder is 10 wtppb or less.

14. A method according to claim 11, wherein the content of oxygen in the powder is 100 wtppm or less.

* * * * *